United States Patent [19]
Hojyo

[11] Patent Number: 4,919,857
[45] Date of Patent: Apr. 24, 1990

[54] METHOD OF MOLDING A PIN HOLDER ON A LEAD FRAME

[76] Inventor: Tetsuya Hojyo, No. 33-6, 3-cho, Wakamatsudai, Sakai-shi, Osaka, Japan

[21] Appl. No.: 237,406

[22] Filed: Aug. 25, 1988

Related U.S. Application Data

[62] Division of Ser. No. 102,585, Sep. 29, 1987, abandoned.

[30] Foreign Application Priority Data

Mar. 11, 1987 [JP] Japan .................................. 62-55808

[51] Int. Cl.5 ...................... B29C 35/08; B29C 39/10
[52] U.S. Cl. ................ 264/22; 264/272.17; 264/273; 264/277
[58] Field of Search ...................... 264/272.16, 272.17, 264/1.7, 1.9, 25, 272.13, 273, 277, 22; 425/116, 12 S; 427/54.1, 96; 437/211, 212

[56] References Cited

U.S. PATENT DOCUMENTS

| | | | |
|---|---|---|---|
| 4,264,549 | 4/1981 | Utner | 264/278 |
| 4,287,226 | 9/1981 | Pirvics et al. | 427/54.1 |
| 4,374,080 | 2/1983 | Schroeder | 264/272.17 |
| 4,540,603 | 9/1985 | Hidaka et al. | 437/211 |
| 4,733,014 | 3/1988 | Fierkens | 357/70 |
| 4,733,292 | 3/1988 | Jarvis | 357/70 |

FOREIGN PATENT DOCUMENTS 221601 9/1983 United Kingdom .................. 357/70

Primary Examiner—James Lowe

[57] ABSTRACT

A method of molding a pin holding structure on a lead frame having a plurality of inner lead pins associated with an island, wherein fluid resinous material is dispensed across successive ones of the inner lead pins and is then hardened while under pressure between flat presser plates. The resin is high in heat resistance as well as in purity, electrical non-conductivity, and low in linear expansibility.

9 Claims, 4 Drawing Sheets

METHOD OF MOLDING A PIN HOLDER ON A LEAD FRAME

This application is a divisional, of application Ser. No. 07/102,585 filed on Sept. 29, 1987, now abandoned.

BACKGROUND OF THE INVENTION

1. Field of the Invention:

This invention relates generally to lead frames which are used to constitute various electronic components such as IC's or LSI's, and more particulary to such a lead frame having a pin holding structure which serves to prevent undesirable deformation of the lead pins during transport of the lead frame or during assembly thereof into an electronic component. The invention also relates to a pin holding method for a lead frame.

2. Description of the Prior Art:

As is well known in the art, lead frames are manufactured by photoetching or press-working a thin metallic strip into a predetermined form to have a longitudinally spaced islands and a plurality of lead pins associated with each island. The metallic strip is usually made of Fe-Ni based alloy, copper, or copper based alloy.

Due to recent demand for further integration or sophistication of semiconductor devices, lead frames to be incorporated in such devices are required to have a very small thickness with its lead pins slenderized and densely arranged. Therefore, the lead pins are becoming increasingly liable to deformation during transport of the lead frame and/or during assembly thereof into an IC, particularly during chip bonding and wire bonding. Such deformation of the lead pins results in poor quality and low yield.

In order to eliminate the above problem, it has been proposed to apply a heat-resistant adhesive tape onto the inner lead pins of a lead frame, so that the inner lead pins are prevented from deformation and resultant shorting. More specifically, the tape consists of a polyimide film coated at one side with an acrylic adhesive. Such adhesive tape is available under the tradename "PYRALUX" from Du Pont Company.

In use, a blank adhesive tape which is originally wide is punched by a die into a segment of suitable shape and dimensions depending on the particular type of lead frame being processed. The tape segment is then transferred onto a specified surface portion of the lead frame, and the taped lead frame is subjected to heat and pressure to maximize adhesion of the tape.

The above pin holding tape, however, has a disadvantage that it necessitates the use of a costly punching die which is designed to suit a particular type (length, width, configuration, etc.) of lead frame and which must be replaced in a time-taking operation by a differetly designed die to suit another type of lead frame. After punching, the tape produces a substantial residual portion, resulting in economical problem in view of the expensive materials of which the tape is made. Further, the tape has a possibility of coming off relatively easily from the lead frame surface.

SUMMARY OF THE INVENTION

It is, therefore, an object of the present invention to provide a lead frame with a pin holding structure which is superior in pin holding function to the prior art taped lead frame, thereby enhancing yield and productivity in assembling into final electronic components.

Another object of the invention is to provide a pin-held lead frame which is excellent in quality.

A further object of the invention is to provide a pin holding method for a lead frame which can be conducted easily and quickly without material losses and without the use of a costly punching die, all regardless of the type of lead frame.

According to one aspect of the invention, there is provided a lead frame with a pin holding structure, the lead frame having a plurality of inner lead pins associated with an island, wherein the pin holding structure comprises a resinous pin holder extending across successive ones of the inner lead pins, the pin holder being made of a hardened resin material which is high in heat resistance as well as in purity, electrically non-conductive, and low in linear expansibility, the pin holder having integral projections each disposed in a gap between adjacent two of the successive inner lead pins.

According to another aspect of the invention, there is provided a pin holding method for a lead frame having a plurality of inner lead pins associated with an island, the method comprising applying a fluid resin material across successive ones of the inner lead pins so that the resin material flows into a gap between each adjacent two of the successive inner lead pins, the resin material being high in heat resistance as well as in purity, electrically non-conductive, and low in linear expansibility, and causing the resin material to harden.

Other objects, features and advantages of the invention will be easily understood from the following detailed description given with reference to the accompanying drawings.

DETAILED DESCRIPTION

Figure 1:
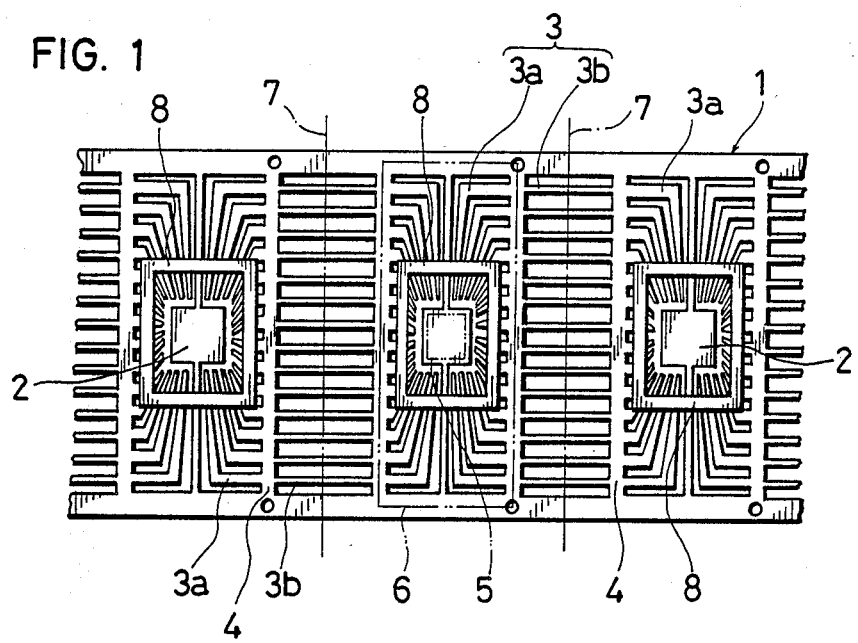
FIG. 1 is a plan view showing a lead frame with a pin holding structure according to the invention.
Figure 2:
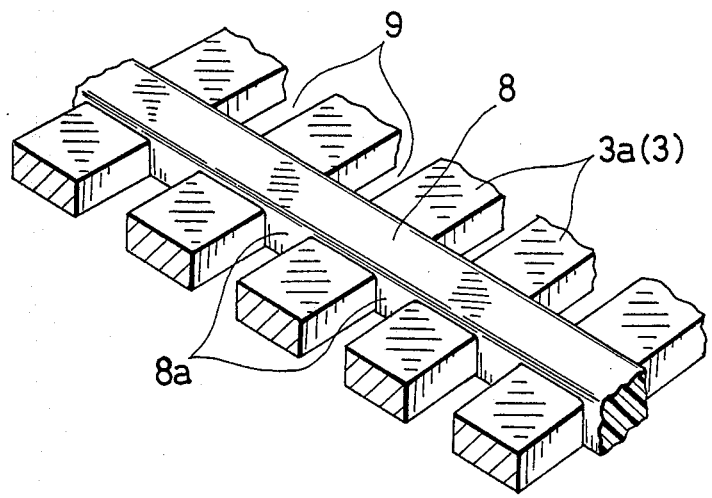
FIG. 2 is an enlarged fragmentary perspective view showing a principal portion of the pin-held lead frame.

Referring now to FIGS. 1 and 2 of the accompanying drawings, there is illustrated a lead frame 1 including longitudinally spaced islands 2. Each island 2 is surrounded by a plurality of inner lead pins 3a connected respectively to a corresponding number of longitudinally extending outer lead pins 3b by way of a dam 4. Each inner lead pin 3a together with its associated outer lead pin 3b constitutes a single lead 3. Such a lead frame is known as "DIP (dual in-line package)" type.

To assemble the lead frame 1 into an electronic component, a semiconductor chip 5 is bonded onto each island 2 and wired to its associated inner lead pins 3a. Then, a portion of the lead frame 1 including the chip 5 and the wired inner lead pins 3a is packaged (molded or encapsulated) into a resin body 6. Finally, the thus formed package 6 is separated from others by cutting the lead frame 1 along lines 7 extending centrally across the outer lead pins 3b. In the finished electronic component, each dam 4 has been partially removed to provide electrical independency between the leads 3.

The arrangement described above is known and does not feature the present invention. The essential features of the invention reside in the following pin holding structure.

As illustrated in FIGS. 1 and 2, the lead frame is provided with a resinous pin holder 8 in corresponding relation to each island 2. According to the illustrated example, the pin holder 8 is in the form of a rectangle surrounding the island 2 and extending across all of the inner lead pins 3a associated with that island 2. The pin holder 2 is located so that it is entirely enclosed within the subsequently formed resin capsule 6 and does not hinder subsequent wire bonding.

As best shown in FIG. 2, the resinous pin holder 8 has a plurality of integral projections 8a each closely fitting in a gap 9 between each adjacent two of the inner lead pins 3a. These projections 8a directly fix the intervals between the inner lead pins 3a and therefore serve very effectively to prevent the pins 3a from deforming or deviating even if some external force is exerted to the lead frame 1 during subsequent transport as well as during subsequent chip bonding and wire bonding. This ensures high yield and quality. Further, the projections 8a provide an increased area of adhesion with respect to the lead frame surface, so that the resinous pin holder 8 will not come off easily, as opposed to the prior art pin holding tape described hereinbefore.

The pin holder 8 may any other configurations than the illustrated rectangle depending on the particular type (length, width, configuration, etc.) of the lead frame 1 being processed. For example, the pin holder 8 may consist of two resinous strips extending parallel to each other only on two opposite sides of each island 2.

On the other hand, the pin holder 8 is required to be made of a hardened resin material which is heat resistant, high in purity, electrically non-conductive, and low in linear expansibility. Further, the resin material should preferably be excellent in adhesion even at high temperatures (200°-260° C.) and non-generative of harmful gases upon thermal decomposition of the material per se.

High heat resistance of the resin material is necessary to ensure thermal stability. Electrical non-conductance is to avoid electrical shorting. Low linear expansibility is required to avoid deformation of the inner lead pins 3a by the thermal expansion of the pin holder 8 itself.

The term "purity" refers to the content of ionic impurities, particularly chlorine ion, within the pin holder material. Such impurities must be excluded because they corrode subsequently bonded aluminum wires.

Various resins meet the above requirements and may be usable depending on the particular material and type of the lead frame 1. Examples include epoxy resin, polybutadiene resin, urethane resin, silicone resin, melamine resin, polyester resin, and acrylic resin. These resins may be modified and applicable in any combination thereof, possibly with the addition of other kinds of resin.

In case the pin holder 8 is made of a resin material identical or similar to that of the package body 6 (FIG. 1), the pin holder 8 is well integrated into the package body. Such integrity serves to prevent gap formation within the package body 6 and thereby entry of air, consequently enhancing quality of the product.

The pin holder 8 is formed on the lead frame 1 in the following manner.

Figure 3:
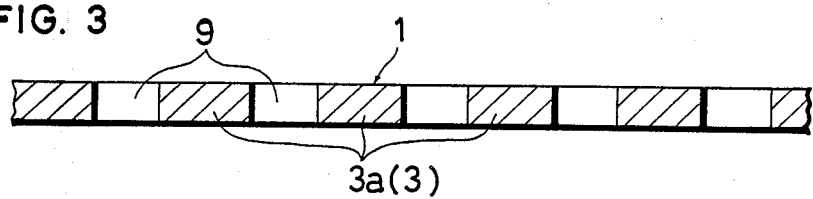
FIG. 3 is a fragmentary sectional view taken across inner lead pins of a lead frame prior to resin application.
Figure 4:
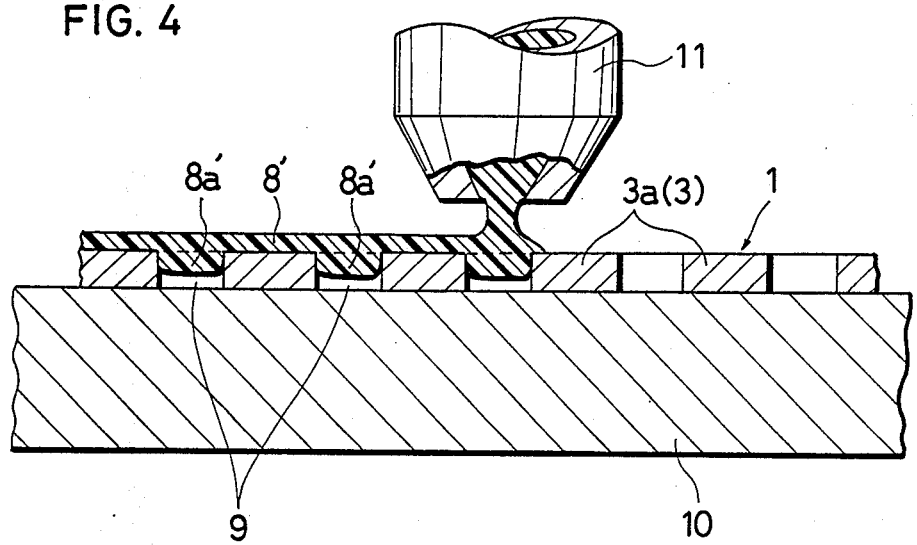
FIG. 4 is a sectional view similar to FIG. 3 but showing the lead frame during resin application.

First, a non-processed lead frame 1 as illustrated in FIG. 3 is formed from a suitable metallic strip by known photoetching or press-working. Then, the lead frame 1 is placed on a positioning table 10, and a fluid resin material 8' is applied from a dispenser 11 onto the inner lead pins 8 of the lead frame 1 in a predetermined pattern (see FIG. 1), as illustrated in FIG. 4. As a result, the fluid resin material 8' partially flows into each gap 9 between two adjacent ones of the inner lead pins 3a. The fluid resin material 8' may be in the form of liquid, cream or paste.

Figure 8:
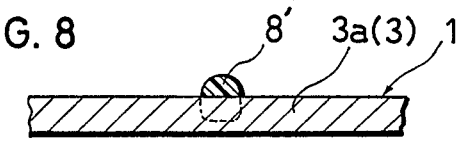
FIG. 8 is a section taken along lines VIII—VIII in FIG. 5.

The lead frame 1 carrying the applied fluid resin material 8' is placed in a curing device 12 comprising for example a pair of reflector plates 13 and an ultraviolet irradiation lamp 14, and therein subjected first to preliminary hardening. This preliminary hardening results in that the applied resin material 8' is hardened mainly in surface but still retains its fluidity or flowability. FIG. 8 shows the state of the resin material 8' after the preliminary hardening.

Figure 6:
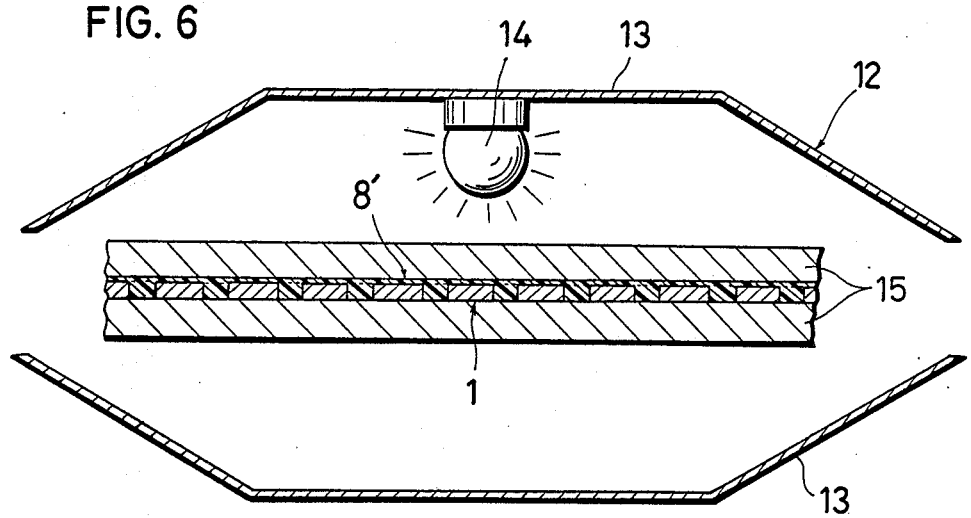
FIG. 6 is also a schematic sectional view showing the resin-applied lead frame during final hardening treatment.
Figure 7:
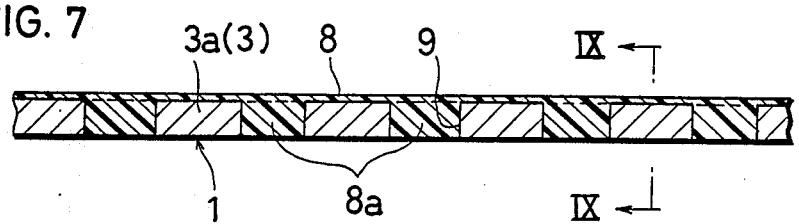
FIG. 7 is a sectional view showing the lead frame with the resin completely hardened.
Figure 9:
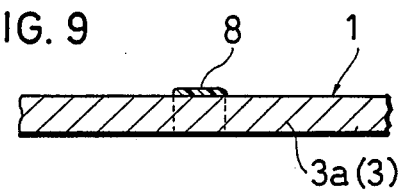
FIG. 9 is a section taken along lines IX—IX in FIG. 7.

Finally, the lead frame 1 carrying the resin material 8' is interposed between a pair of flat presser plates 15 and subjected to final hardening treatment with the curing device 12, as illustrated in FIG. 6. As a result, a complete resinous pin holder 8 is formed which has a flattened top surface and a plurality of integral projections 8a each fitting closely in the gap 9 between adjacent two of the inner lead pins 3a, as shown in FIGS. 7 and 9.

Figure 5:
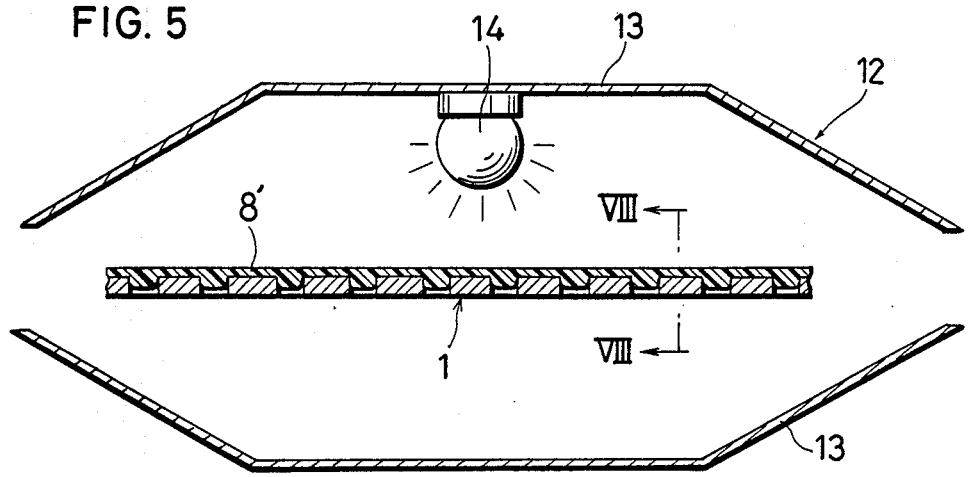
FIG. 5 is a schematic sectional view showing the resin-applied lead frame during preliminary hardening treatment.

According to the example illustrated in FIGS. 5 and 6, the fluid resin material 8' is hardened by ultraviolet irradiation. In this case, the presser plates 15 must be made of a transparent material, such as silica glass, which has good transmission for ultraviolet rays.

Alternatively, the fluid resin material 8' may be hardened by heating or at room temperature or by combination of ultraviolet irradiation and heating. Thus, the method of hardening may be selected depending on a particular resin material which in turn is selected depending on a particular type (length, width, material, configuration, etc.) of the lead frame 1.

Among the examples of resin material listed hereinbefore, epoxy resin, polybutadiene resin, urethane resin, silicone resin, melamine resin, and polyester resin are hardenable by ultraviolet irradiation. Polyester resin and silicone resin are also hardenable by heating or by combination of heating and ultraviolet irradiation. Also hardenable by heating or by combination of heating and ultraviolet irradiation are some types of epoxy resin and acrylic resin, typical examples including an epoxy resin reactable with an acid anhydride as well as an acrylic resin reactable with a peroxide. Further, silicone resin is also hardenable at room temperature. An epoxy resin reactable with an amine is also a typical example which hardens at room temperature.

According to the pin holding method described above, the fluid resin material 8' can be applied to the lead frame 1 in any desired pattern and without loss of the resin material by means of the dispenser 11 which needs not be exchanged even if the lead frame 1 is replaced by another of different type. This is much more advantageous over the prior art taping method in which an adhesive tape is punched into a required shape with inevitable loss of the tape material by means of a costly punching die which has to be replaced by another upon change in type of lead frames to be processed.

The material cost for conducting the pin holding method according to the present invention is reduced down to about Yen 0.002–0.005 per package when a liquid epoxy resin hardenable by ultraviolet irradiation is used as the fluid resin material 8' for holding the inner lead pins of a DIP type lead frame. On the other hand, the prior art taping method requires a material cost of about Yen 0.3–0.5 per package.

Figure 10:
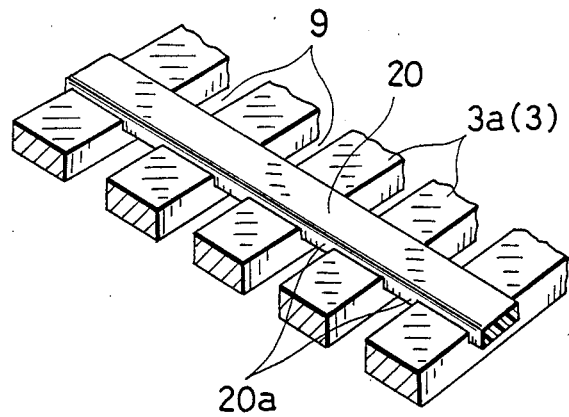
FIG. 10 is a perspective view similar to FIG. 2 but showing a portion of a modified pin holder.
Figure 11:
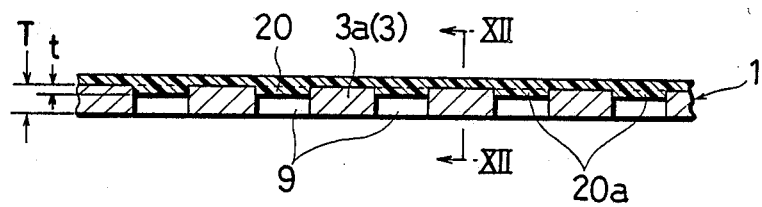
FIG. 11 is a sectional view similar to FIG. 7 but showing the modified pin holder of FIG. 10.
Figure 12:
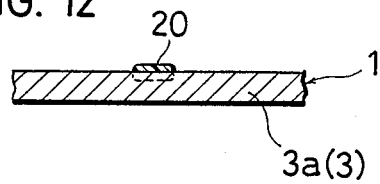
FIG. 12 is a section taken along lines XII—XII in FIG. 11.

FIGS. 10 to 12 illustrate a modification in which a resinous pin holder 20 has a plurality of integral projections 20a whose height t is smaller than the thickness T of the lead frame 1 (inner lead pin 3a). Apparently, this modification ensures further reduction in material cost while retaining the advantages of the foregoing embodiment.

The invention being thus described, it is obvious that the same may be varied in many ways. For instance, the top surface of each resinous pin holder 8 may be flattened by a pallet instead of the flat presser plates 15. Further, the top surface of the pin holder 8 may not be flattened so long as it projects only slightly beyond the lead frame 1. Such variations are not to regarded as a departure from the spirit and scope of the invention, and all such modifications as would be obvious to those skilled in the art are intended to be included within the scope of the following claims.

I claim:

1. A pin holding method for a lead frame having a plurality of inner lead pins associated with an island, the method comprising:
    applying a fluid resin material directly through a dispenser across successive ones of said inner lead pins so that said resin material flows into a gap between each adjacent two of said successive inner lead pins, said resin material being high in heat resistance as well as in purity, electrically non-conductive, and low in linear expansivity;
    causing said resin material to harden; and
    wherein said lead frame together with said resin material is interposed under pressure between a pair of flat presser plates while said resin material is hardened.

2. The pin holding method as defined in claim 1, wherein
    said resin material applied to said lead frame is subjected to preliminary hardening prior to final hardening.

3. The pin holding method as defined in claim 1, wherein
    said resin material applied to said lead frame is caused to harden by ultraviolet irradiation.

4. The pin holding method as defined in claim 1, wherein
    said resin material applied to said lead frame is caused to harden by heating.

5. The pin holding method as defined in claim 1, wherein
    said resin material applied to said lead frame is caused to harden at room temperature.

6. The pin holding method as defined in claim 1, wherein
    said resin material applied to said lead frame is caused to harden by combination of ultraviolet irradiation and heating.

7. The pin holding method as defined in claim 1, wherein
    said resin material is selected from the group consisting of epoxy resin, polybutadiene resin, urethane resin, silicone resin, melamine resin, polyester resin, and acrylic resin.

8. The pin holding method as defined in claim 1, wherein
    said presser plates are transparent; and
    said resin material applied to said lead frame is caused to harden by ultraviolet irradiation.

9. The pin holding method as defined in claim 1, wherein
    said presser plates are transparent; and
    said resin material applied to said lead frame is caused to harden by combination of ultraviolet irradiation and heating.

* * * * *